(12) United States Patent
Jeong et al.

(10) Patent No.: US 9,711,574 B2
(45) Date of Patent: Jul. 18, 2017

(54) ORGANIC LIGHT EMITTING DISPLAY PANEL AND METHOD OF MANUFACTURING THE SAME

(71) Applicant: LG Display Co., Ltd., Seoul (KR)

(72) Inventors: Ilgi Jeong, Chungcheongbuk-do (KR); JeongHoon Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/998,111

(22) Filed: Dec. 23, 2015

(65) Prior Publication Data

US 2016/0190218 A1 Jun. 30, 2016

(30) Foreign Application Priority Data

Dec. 24, 2014 (KR) ........................ 10-2014-0188086

(51) Int. Cl.
*H01L 27/32* (2006.01)
*H01L 51/52* (2006.01)
*H01L 51/56* (2006.01)

(52) U.S. Cl.
CPC ........ *H01L 27/3246* (2013.01); *H01L 27/322* (2013.01); *H01L 27/3213* (2013.01); *H01L 27/3216* (2013.01); *H01L 27/3248* (2013.01); *H01L 51/5206* (2013.01); *H01L 51/5221* (2013.01); *H01L 51/5225* (2013.01); *H01L 51/56* (2013.01); *H01L 2227/323* (2013.01)

(58) Field of Classification Search
CPC ............. H01L 27/3213; H01L 27/3216; H01L 27/322; H01L 27/3246; H01L 27/3248; H01L 51/5206; H01L 51/5221; H01L 51/5225; H01L 51/56
See application file for complete search history.

(56) References Cited

U.S. PATENT DOCUMENTS

| 8,330,353 B2 * | 12/2012 | Choi ..................... H01L 27/322 313/504 |
| 2007/0194677 A1 | 8/2007 | Liu et al. |
| 2008/0169461 A1 | 7/2008 | Park |
| 2013/0120981 A1 * | 5/2013 | Kim ......................... F21V 9/08 362/231 |
| 2014/0028181 A1 * | 1/2014 | Lee ........................ H05B 33/14 313/504 |
| 2015/0249120 A1 | 9/2015 | Cheng et al. |

(Continued)

FOREIGN PATENT DOCUMENTS

CN 103456764 A 12/2013

OTHER PUBLICATIONS

European Extended Search Report, European Application No. 15202400.6, Jun. 1, 2016, 8 pages.

*Primary Examiner* — Allan R Wilson
(74) *Attorney, Agent, or Firm* — Fenwick & West LLP

(57) ABSTRACT

Embodiments relate to an organic light emitting display device and a method of manufacturing the same. The organic light emitting display device includes a pixel area that includes at least a first sub pixel area. The first sub pixel area includes a color filter, a first overcoat element on the color filter, wherein a portion of the color filter at an edge portion of the first sub pixel area is not covered by the first overcoat element, and an electrode disposed on the pixel area, wherein the electrode is on the portion of the color filter not covered by the first overcoat element.

16 Claims, 13 Drawing Sheets

(56) References Cited

U.S. PATENT DOCUMENTS

2016/0087247 A1\* 3/2016 Kim .................... H01L 51/5284
257/40
2016/0181328 A1\* 6/2016 Zhang ................ H01L 27/3213
257/40

\* cited by examiner

ORGANIC LIGHT EMITTING DISPLAY PANEL AND METHOD OF MANUFACTURING THE SAME

CROSS REFERENCE TO RELATED APPLICATION

This application claims priority from and the benefit under 35 U.S.C. §119(a) of Republic of Korea Patent Application No. 10-2014-0188086, filed on Dec. 24, 2014, which is incorporated by reference herein in its entirety.

BACKGROUND OF THE INVENTION

1. Field of the Invention

The present invention relates to an organic light emitting display panel, and organic light emitting display device including said panel, and a method of manufacturing the same.

2. Description of the Prior Art

As the information society develops, display devices for displaying an image are being increasingly required in various forms, and in recent years, various display devices such as Liquid Crystal Displays (LCDs), Plasma Display Panels (PDPs), and Organic Light Emitting Display Devices (OLEDs) have been utilized. Such a display device includes a display panel corresponding to the display device.

Meanwhile, a plurality of pixels is positioned in a display panel, and the pixel may be divided into red, green, blue and white sub pixels. The sub pixels may use color filters which limit a wavelength of specific light or move a wavelength band of light in each sub pixel, in order to implement a color. Meanwhile, a light leakage may occur with two or more colors of light or a stitch spot if there is an emission of light reflected to a neighboring sub pixel, which should not emit light. Hence, color and emission level may be changed. Therefore, a technique for blocking a light leakage in a sub pixel where light is not emitted is required.

SUMMARY OF THE INVENTION

In this background, an aspect of the present invention is to provide a display panel and a method for manufacturing the same, or a display device including the same, for preventing a light leakage from a sub pixel area with a color filter into an adjacent sub pixel area, and in particular into an adjacent sub pixel area where a color filter is not formed. Another aspect of the present invention is to provide a display panel and a method for manufacturing the same, or a display device including the same in which a color filter is adhered to or in contact with an electrode (e.g. a cathode) such that light reflected from the electrode is input to the color filter again in order to prevent a light leakage. That is, a display panel may be provided wherein in a sub pixel area, an electrode is formed on an organic light emitting element, the organic light emitting element being formed on a color filter. Alternatively, the electrode may be formed directly on the color filter.

An aspect of the present invention is to provide a method of manufacturing a display panel or a display device including the same in which an overcoat and/or bank are not formed in a boundary area of a color filter such that the color filter is adhered to an electrode.

The objects are solved by the features of the independent claims.

An aspect of the present invention provides an organic light emitting display panel or a display device including the same, the panel comprising a pixel area that includes a plurality of first electrodes connected to a thin film transistor (e.g. to a source electrode or a drain electrode of the thin film transistor), a, first sub pixel area where a color filter is positioned and a second sub pixel area that is adjacent to the first sub pixel area. An overcoat may be positioned and disconnected between the first sub pixel area and the second sub pixel area. A first bank may be positioned at a boundary or edge portion of the first sub pixel area, and a second bank may be positioned at a boundary or edge portion of the second sub pixel area. The pixel area may include at least two sub pixel areas. The panel may further comprise a plurality of thin film transistors disposed at intersect areas in which a plurality of data lines and a plurality of gate lines intersect.

Further, a second electrode may be positioned on the first sub pixel area and the second sub pixel area, and may contact the color filter between the first bank and the second bank or positioned on an organic light emitting element in contact with the color filter. Further, the second electrode may include a vertical structure in contact with the color filter at a boundary of the color filter.

Preferably, the overcoat is disconnected between the first bank and the second bank. Preferably, a boundary of the disconnected overcoat element may be positioned between the first bank and the second bank. Preferably, no color filter is positioned in the second sub pixel area. A ratio of an area of the overcoat element in the first sub pixel to the first sub pixel area may be smaller than a ratio of an area of the overcoat element in the second sub pixel to the second sub pixel area.

Another aspect of the present invention provides a method of manufacturing an organic light emitting display panel or a display device including the same, as described above. The method comprises at least one of: forming a first electrode that applies a signal to the thin film transistor; forming a color filter in a sub pixel area; and forming an overcoat element on the color filter such that the overcoat element is disconnected at a boundary of the sub pixel area; and forming a second electrode on the color filter. Preferably, forming a first electrode includes forming a thin film transistor for controlling a pixel in a plurality of pixel areas, and a line. Preferably, the method includes further forming a bank on a boundary or edge portion of the overcoat. Then, an organic light emitting element may be formed on the bank and the overcoat element and the second electrode may be formed on the organic light emitting element. Preferably, the forming of the overcoat element comprises: spreading the overcoat material on a whole surface of the color filter; and etching the overcoat material using a mask which exposes the boundary of the sub pixel area. Preferably, the forming of the bank comprises: spreading the bank on a whole surface of the color filter and the overcoat element; and etching the bank using a mask which exposes the boundary of the sub pixel area. A boundary of the disconnected overcoat may be positioned between a first bank of a first sub pixel area and a second bank of a second sub pixel area.

According to one aspect, an organic light emitting display panel, or a display device including the same, may comprise a pixel that includes at least a first sub pixel, the first sub pixel including a color filter and an overcoat element formed on the color filter, wherein a portion of the color filter at a boundary or edge portion of the first sub pixel remains uncovered, i.e. exposed, by the overcoat element. That is, there is a gap between a boundary of the first sub pixel and a boundary of the overcoat element (when viewed perpendicular to the panel plane or display area). Further, the display panel may include an electrode disposed over the pixel area. Preferably, a part of the electrode may be formed on the color filter including the portion not covered by the overcoat element. Hence, the electrode may have a vertical portion, i.e. a portion approximately perpendicular to the plane of the display panel or of a substrate. Here, the terms vertical or perpendicular may include an angle of 0° to 45° between a tangent on the electrode surface and a normal of the plane of the display panel or substrate. Further, a thickness of the color filter (i.e. perpendicular to the plane) may decrease at a boundary portion or edge portion of the sub pixel area. Possibly, at least a part of the boundary of the color filter may be located within the boundary of the sub pixel, so that the boundary of the sub pixel may remain exposed by the color filter. Preferably, the electrode is a cathode. The electrode may cover all sub pixel areas of the pixel area. The electrode may be directly formed on the portion of the color filter not covered by the overcoat element, or on an organic light emitting element which is directly formed on the portion of the color filter not covered by the overcoat element.

Another electrode may be provided in each sub pixel, e.g. a pixel electrode, preferably an anode, which may be disposed on the overcoat element and connected to a thin film transistor of the display panel.

In one embodiment, the overcoat element area of the first sub pixel is smaller than that of the first sub pixel area and/or than an area of the color filter of the first sub pixel.

In one embodiment, a bank is provided in the first sub pixel area. The bank may be formed at a boundary or edge portion of the first sub pixel area, wherein a portion of the color filter may be exposed, i.e. not covered, by the overcoat element and by the bank. The bank may be provided adjacent or next to the portion of the color filter not covered, i.e. without covering the same. A boundary of the bank and a boundary of the overcoat element preferably coincide. Also, the bank may be formed partially in direct contact with the overcoat element and partially in direct contact with the color filter.

The pixel area may include further a second sub pixel area that is adjacent to the first sub pixel area. Preferably no color filter is provided in the second sub pixel area. The overcoat element of the first sub pixel may have a smaller area than an overcoat element of the second sub pixel area. Preferably, the second sub pixel area is smaller than the first sub pixel area. The overcoat element of the first sub pixel area and an overcoat element of the second sub pixel area may expose a boundary between the first sub pixel area and the second sub pixel area, i.e. there is no overcoat in a boundary area between the first and second sub pixels. That is, the overcoat element may be disconnected between the sub pixels of a pixel. Preferably, a gap is formed between overcoat elements of the first sub pixel area and the second sub pixel area at a boundary between the first sub pixel area and the second sub pixel area.

According to another aspect, a method of manufacturing an organic light emitting display panel with a pixel area including at least a first sub pixel area may include forming a color filter in the first sub pixel area, and forming an overcoat element on the color filter except for a portion of the color filter at a boundary or edge portion of the first sub pixel area. Thus, a portion of the color filter at the boundary of the first sub pixel may remain not covered, i.e. exposed, by the overcoat element. Further, the method may include forming an electrode on the exposed portion of the color filter. The electrode may be formed over the whole pixel area. Further, the method may include forming a bank on a boundary or edge portion of the overcoat. Preferably, an organic light emitting element is formed on at least one of the bank, the overcoat element, and the portion of the color filter not covered by the overcoat element. Therefore, the electrode may either be formed directly on the uncovered portion of the color filter, or directly on the organic light emitting element, which is directly formed on the uncovered portion of the color filter. Forming the overcoat element may include spreading the overcoat material on a whole surface of the color filter and etching the overcoat using a mask which exposes the boundary of color filter at the boundary of the first sub pixel area. Forming the bank may comprise spreading the bank on a whole surface of the color filter and the overcoat element and etching the bank using a mask which exposes the boundary of the color filter at the boundary of the first sub pixel area. A boundary of the overcoat element may be positioned in a boundary area between a first bank of the first sub pixel area and a second bank of a second sub pixel area.

As described above, according to the present invention, an overcoat element and a bank are positioned on sub pixel areas, wherein a structure in which an electrode (e.g. a cathode) faces a screen and is horizontally disposed is changed. Thus, in a process in which light reflected by the electrode is emitted to the screen, an emission to an adjacent sub pixel area is prevented, and thus a color sense and a stitch spot can be removed.

In addition, according to the present invention, an overcoat element and/or a bank may expose a portion of a color filter. Thus, a distance between an electrode and the color filter may become narrow, and light reflected by the electrode may pass through the color filter.

In addition, according to the present invention, since an electrode (e.g. a cathode) is made to be in contact with a color filter and an organic light emitting element is interposed between the electrode and the color filter, light reflected by the electrode is input to the color filter, and thus a color mixing and a stitch spot are removed.

Embodiments also relate to an organic light emitting display panel that includes a pixel area with at least a first sub pixel area. The first sub pixel area includes a color filter, a first overcoat element on the color filter. A portion of the color filter at an edge portion of the first sub pixel area is not covered by the first overcoat element. The first sub pixel area further includes an electrode disposed on the pixel area, wherein the electrode is on the portion of the color filter not covered by the first overcoat element.

In one embodiment, the electrode is in direct contact with the portion of the color filter not covered by the first overcoat element, or the electrode is in direct contact with an organic light emitting element, the organic light emitting element in direct contact with the portion of the color filter not covered by the first overcoat element.

In one embodiment, the first sub pixel area further includes a pixel electrode disposed on the first overcoat element. The pixel electrode is connected to a thin film transistor of the display panel.

In one embodiment, the first overcoat element has a smaller area than the first sub pixel area and/or than the color filter of the first sub pixel area.

In one embodiment, a boundary of the overcoat element is offset from a boundary of the color filter.

In one embodiment, the first sub pixel area further includes a bank formed in an edge portion of the first sub pixel area. The portion of the color filter is not covered by the first overcoat element and the bank.

In one embodiment, at least a portion of the bank is positioned on the first overcoat element, and a boundary of the bank and the boundary of the first overcoat element coincide, or the boundary of the bank is offset from the boundary of the first overcoat element, such that the portion of the bank directly contacts the first overcoat element and another portion of the bank directly contacts the color filter.

In one embodiment, the pixel area further includes a second sub pixel area that is adjacent to the first sub pixel area. The second sub pixel area includes no color filter.

In one embodiment, the first overcoat element of the first sub pixel area has a smaller area than an area of a second overcoat element of the second sub pixel area.

In one embodiment, the second sub pixel area is smaller than the first sub pixel area.

In one embodiment, the first overcoat element of the first sub pixel area and a second overcoat element of the second sub pixel area are disconnected from each other to expose a boundary between the first sub pixel area and the second sub pixel area, and/or a gap is formed between the first overcoat element of the first sub pixel area and the second overcoat element of the second sub pixel area at the boundary between the first sub pixel area and the second sub pixel area.

In one embodiment, the electrode is a cathode of the organic light emitting display panel.

Embodiments also relate to a method of manufacturing an organic light emitting display panel with a pixel area including at least a first sub pixel area. A color filter is formed in the first sub pixel area. A first overcoat element is formed on the color filter in the first sub pixel area, wherein a portion of the color filter at an edge portion of the first sub pixel area is not covered by the first overcoat element. An electrode is formed on the pixel area, wherein the electrode is on the portion of the color filter not covered by the first overcoat element.

In one embodiment, at least a portion of a first bank of the first sub pixel area is formed on an edge portion of the first overcoat element. An organic light emitting element is further formed on the first bank and the first overcoat element.

In one embodiment, a boundary of the first bank and a boundary of the first overcoat element coincide, or the boundary of the first bank is offset from the boundary of the first overcoat element, such that the portion of the bank directly contacts the first overcoat element and another portion of the bank directly contacts the color filter.

In one embodiment, overcoat material is spread on a whole surface of the color filter. The overcoat material is etched using a mask which exposes the portion of the color filter to form the first overcoat element.

In one embodiment, bank material is spread on a whole surface of the color filter and the first overcoat element. The bank material is etched using a mask which exposes the portion of the color filter.

In one embodiment, a second overcoat element is formed in a second sub pixel area adjacent to the first sub pixel area, wherein the first overcoat element and the second overcoat element are disconnected from each other to expose a boundary between the first sub pixel area and the second sub pixel area. A second bank is formed on the second overcoat element in the second sub pixel area, wherein the second bank is disconnected from the first bank.

In one embodiment, a boundary of the second overcoat element is positioned in between the first bank of the first sub pixel area and the second bank of the second sub pixel area.

It is to be understood that both the foregoing general description and the following detailed description are exemplary and explanatory and are intended to provide further explanation of the invention as claimed.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Figure 1:
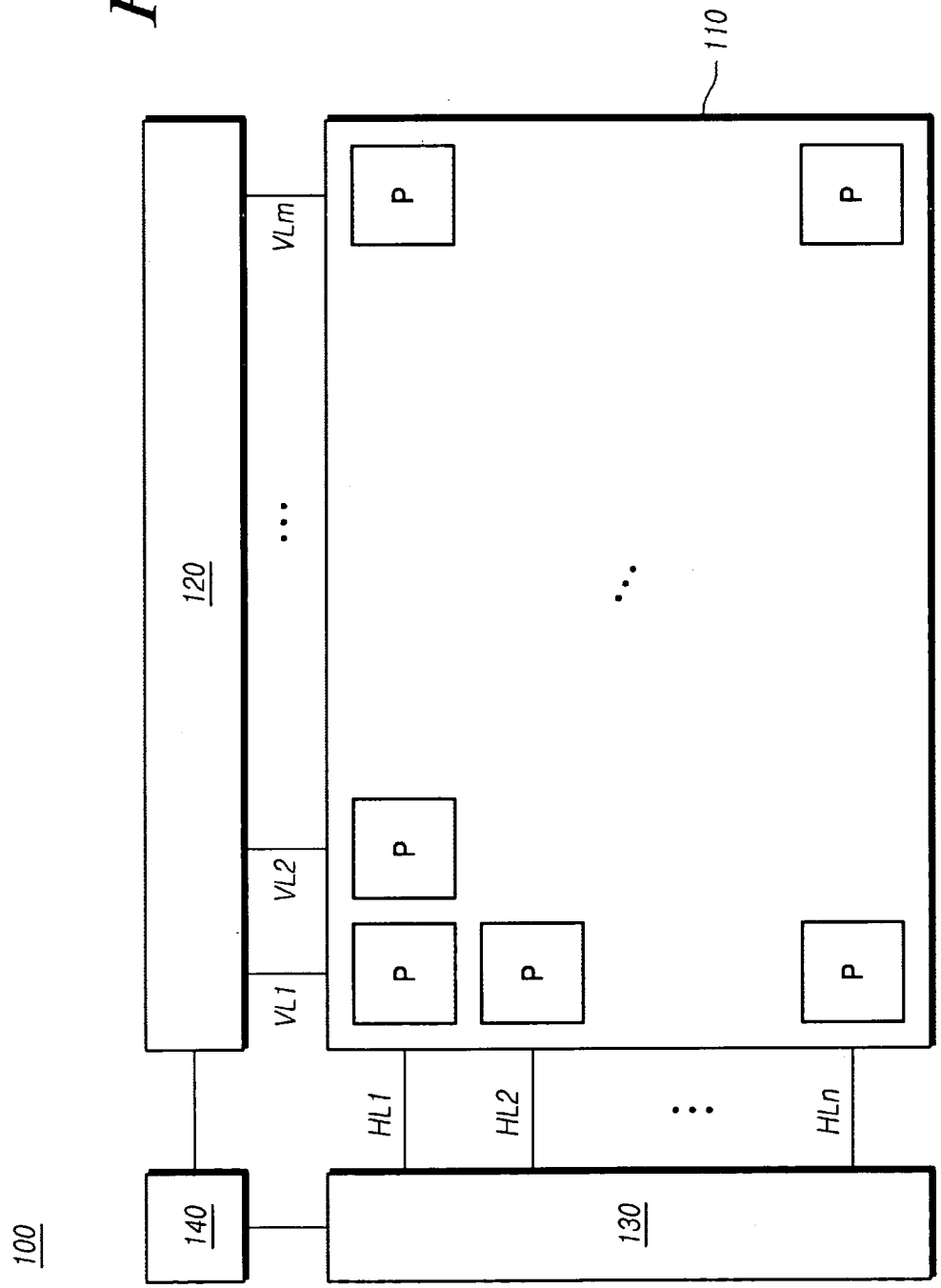
FIG. 1 is a schematic view illustrating a display device according to an embodiment of the present invention.

Hereinafter, embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a schematic view illustrating a display device according to an embodiment of the present invention. Referring to FIG. 1, the display device 100 according to an embodiment includes a display panel 110 in which a plurality of first lines VL1 to VLm are formed in a first direction (for example, a vertical direction) and a plurality of second lines HL1 to HLn are formed in a second direction (for example, a horizontal direction), a first driving unit 120 for supplying a first signal to the plurality of first lines VL1 to VLm, a second driving unit 130 for supplying a second signal to the plurality of second lines HL1 to HLn, and a timing controller 140 for controlling the first driving unit 120 and the second driving unit 130.

A plurality of pixels P are defined in the display panel 110 as where the plurality of first lines VL1 to VLm formed in the first direction (for example, a vertical direction) and the plurality of second lines HL1 to HLn formed in the second direction (for example, a horizontal direction) cross each other.

Each of the above-mentioned first driving unit 120 and second driving unit 130 may include at least one driving integrated circuit outputting a signal for an image display.

The plurality of first lines VL1 to VLm formed in the display panel 100 in the first direction may be, for example, data lines formed in the vertical direction (first direction), for transferring a data voltage (first signal) to vertical columns of pixels, and the first driving unit 120 may be a data driving unit for supplying a data voltage to the data lines.

In addition, the plurality of second lines HL1 to HLn formed in the display panel 110 in the second direction may be gate lines formed in the horizontal direction (second direction), for transferring a scan signal (first signal) to horizontal rows of pixels, and the second driving unit 130 may be a gate driving unit for supplying a scan signal to the gate lines.

In addition, a pad part is configured in a display panel 110 in order to access the first driving unit 120 and the second driving unit 130. The pad part transfers the first signal to the display panel 110 when the first driving unit 120 provides the first signal to the plurality of first lines VL1 to VLm. In the same manner, the pad part transfers the second signal to the display panel 110 when the second driving unit 130 provides the second signal to the plurality of second lines HL1 to HLn. Therefore, the pad part may be formed in a process of forming an area of the pixels in the display panel 110.

To sum up FIG. 1, it may be as follows. An organic light emitting display device 100 includes a display panel 110 with a plurality of thin film transistors disposed at intersections of the plurality of data lines VL1, . . . , VLm and the plurality of gate lines HL1, . . . , HLn. A plurality of pixel electrodes may be connected to the thin film transistors, respectively, i.e. to a source electrode or a drain electrode of the thin film transistor. The display panel 110 may include a pixel area with a plurality of pixels, wherein each pixel may include two or more sub pixels. Further, the display device 100 may include a data driving unit 120 driving the plurality of data lines VL1, . . . , VLm, and a gate driving unit 130 driving the plurality of gate lines HL1, . . . , HLm.

Figure 2:
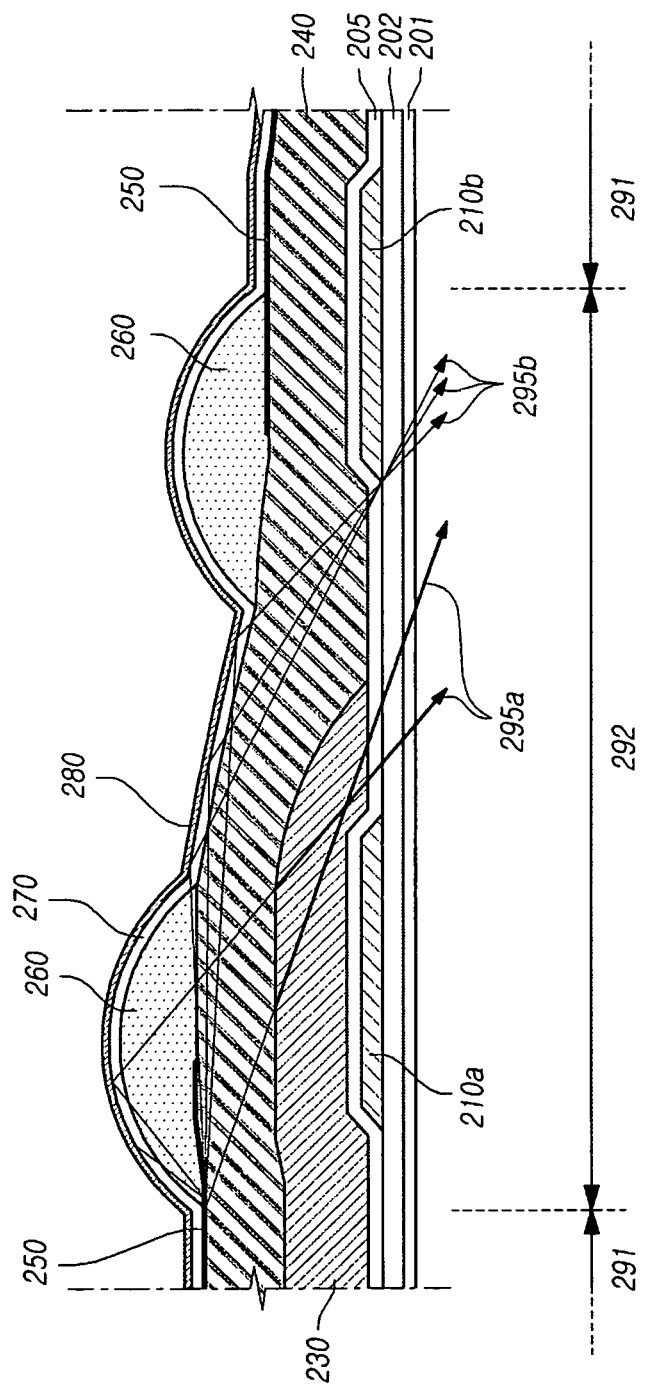
FIG. 2 is a view illustrating reflection of light by a cathode.

FIG. 2 is a view illustrating reflection of light by a cathode. An interlayer dielectric 202, data lines 210a and 210b, a protecting layer (e.g., a passivation layer) 205, a color filter 230, an overcoat 240, a pixel electrode 250 which is a first electrode, and a bank 260 may be formed on a buffer 201. An organic light emitting element 270 may be formed on the pixel electrode 250 and the bank 260. A second electrode 280 facing the first electrode may be positioned on the organic light emitting element 270. In an embodiment of the present invention, the first electrode 250 is an anode electrode and the second electrode 280 is a cathode electrode. However, the present invention is not limited thereto.

The first electrode 250 may be a cathode electrode and the second electrode 280 may be an anode electrode. Also, the first electrode 250 may be transparent.

Meanwhile, an area 291 where the first electrode directly makes contact with the organic light emitting element 270 is an opening area. An area 292, where the first electrode 250 is not positioned or where the first electrode is not in contact with the organic light emitting element 270, is a non-opening area. In the non-opening area, also at least one data line 210a and/or 210b may be positioned. The organic light emitting element 270 emits light in the opening area 291. Meanwhile, in the non-opening area 292, light is reflected by the second electrode 280, and thus light may be emitted. A reference numeral 295a indicates a light leakage which occurs when light is reflected by the second electrode 280 and passes through the color filter 230. A reference numeral 295b indicates a light leakage which occurs when light is reflected by the second electrode 280 without passing through the color filter. As shown in FIG. 2, the light leakage 295a in a sub pixel where the light reflected by the second electrode 280 is emitted and the light leakage 295b in an adjacent sub pixel where light is not emitted generate a light leakage of two types of light colors, and thus degrade visibility. That is, a color sensing difference is generated in a panel due to the light leakage between the adjacent sub pixel areas 293 and 294, and a stitch spot may occur in a boundary of an exposure shot. In order to prevent this, in the present invention, it is prevented that an overcoat and/or a bank may become a light path for light reflected by the second electrode 280 into a neighboring second sub pixel, i.e. without passing through the color filter of the first sub pixel. For this, a vertical structure may be provided in a sub pixel area in order to enable the color filter to be adhered to the second electrode layer as closely as possible, such that light reflected by the second electrode 280, e.g. the cathode, passes through the pigment of the color filter 280. Therefore, a light leakage except for an emitting sub pixel is blocked, and thus a color sensing difference between a light leakage passing through the color filter 230 and a light leakage not passing through the color filter 230 and a stitch spot can be removed.

Figure 3:
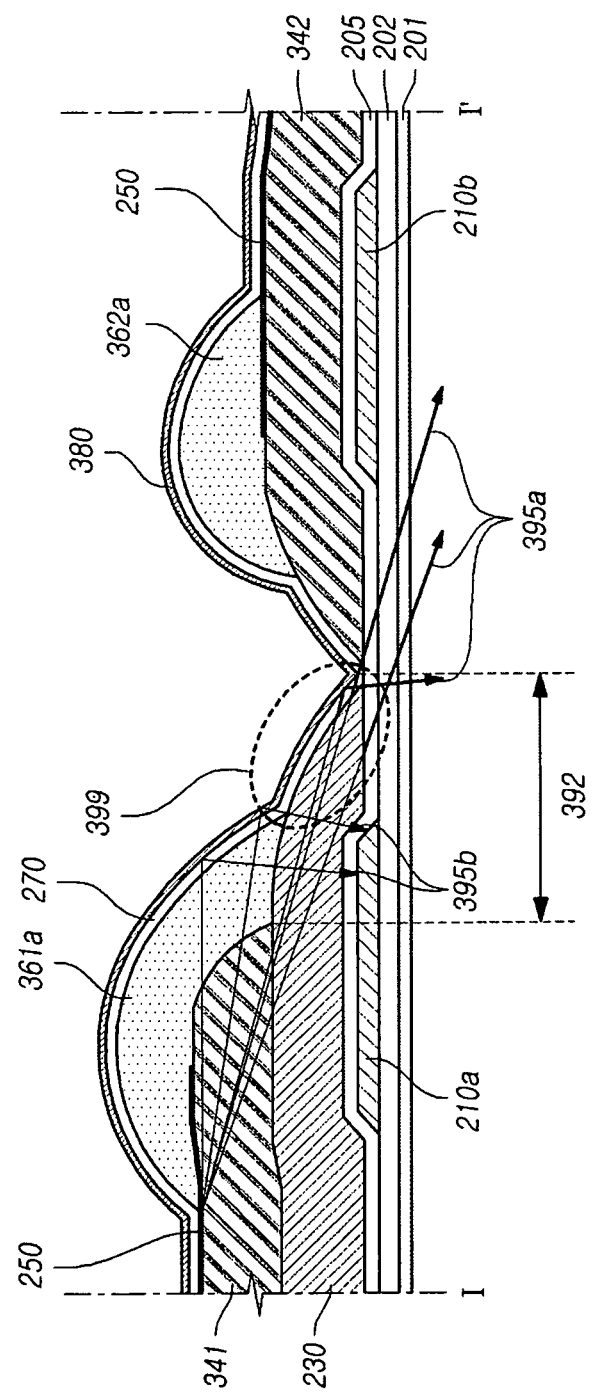
FIG. 3 is a view illustrating a structure of an organic light emitting display device according to an embodiment of the present invention.

FIG. 3 is a view illustrating a structure of an organic light emitting display device according to an embodiment of the present invention. FIG. 3 shows a cross section taken along line I-I' of FIG. 8 described later. The elements up to color filter 230 are the same as those of FIG. 2. Overcoat elements 341 and 342 positioned on the color filter 230 and the protecting layer 205, respectively, are disconnected at an area 392 where the color filter 230 is positioned in the non-opening area. That is, the overcoat within a pixel area is disconnected between sub pixels. Thus, a hole corresponding to the area 392 may be formed between the overcoat elements 341 and 342, separating the overcoat in a first overcoat element 341 and a second overcoat element 342. In other words, the overcoat element 341 of the first sub pixel 591 exposes a portion of the color filter 230 of the first sub pixel 591 at a boundary or edge portion of the first sub pixel 591. Meanwhile, a bank 361 is formed in a portion of an area where the overcoat is not formed. At the area indicated by reference numeral 399, the organic light emitting layer 270 may be directly formed on the color filter 230 and the second electrode 380 may be directly formed on the organic light emitting layer 270, such that light reflected by the second electrode 380 passes through the color filter 230. Thus, the cathode 380 is close to the color filter 230. In other words, only the organic light emitting layer 270 may be interposed between the cathode 380 and the color filter 230.

Therefore, light from the first electrode 250 may be reflected by the cathode 380, passing through the color filter 230 and blocked by line 210*a* as indicated by 395*b* and light may further be transmitted through the color filter 230 as indicated by 395*a*. Since all pieces of light reflected by the cathode pass through the color filter 230, a color sensing difference does not occur.

The color sensing difference has occurred due to different light leakages between two sub pixel areas having different colors, that is, between a non-emissive sub pixel and an emitting sub pixel. However, the structure of FIG. 3 is applied to the present invention, so that a distance between the reflecting second electrode (cathode) and the color filter is minimized at a boundary of the sub pixel. Since a distance between the cathode 380 and the color filter 230 which are positioned at the boundary is 0 or corresponds to the thickness of the organic light emitting element 270, the light reflected by the cathode 380 passes through the color filter 230, and light of a color of the color filter 230 is emitted to the outside. As shown in FIG. 3, the color filter 230 and the second electrode 380, respectively, may include a vertically formed portion in an area between adjacent sub pixels, i.e. a portion formed perpendicularly to a plane of the display panel 110. Thus, a conventional structure is changed, in which an overcoat is continuously formed between sub pixel areas, and a cathode faces a screen and is continuously positioned in a substantially horizontal orientation, i.e. parallel to the display panel. In addition, in a process in which light reflected by the cathode is emitted to the screen, an emission to an adjacent sub pixel area can be prevented, and thus a color sensing difference and a stitch spot can be removed.

The first and second overcoat elements 341 and 342 of the first and second sub pixels 591 and 592 may be disconnected between a first and second bank 361*a* and 362*a* which are positioned at the boundaries of the first and second sub pixels, respectively. Thus, also the bank may be disconnected at the boundary of the sub pixel areas, so that the first sub pixel 591 may include a first bank 361*a* and the second sub pixel 592 may include a second bank 362*a*. Therefore, the first and second overcoat elements 341 and 342 and the two banks 361*a* and 362*a* may expose a portion of the boundary of the color filter 230. In particular, the first overcoat element 341 and the first bank 361*a* of the first sub pixel may expose a portion of the color filter 230 at the boundary of the first sub pixel. Thus, a distance between the second electrode 380 and the color filter 230 may become small, and light reflected by the second electrode may pass through the color filter 230.

Figure 4:
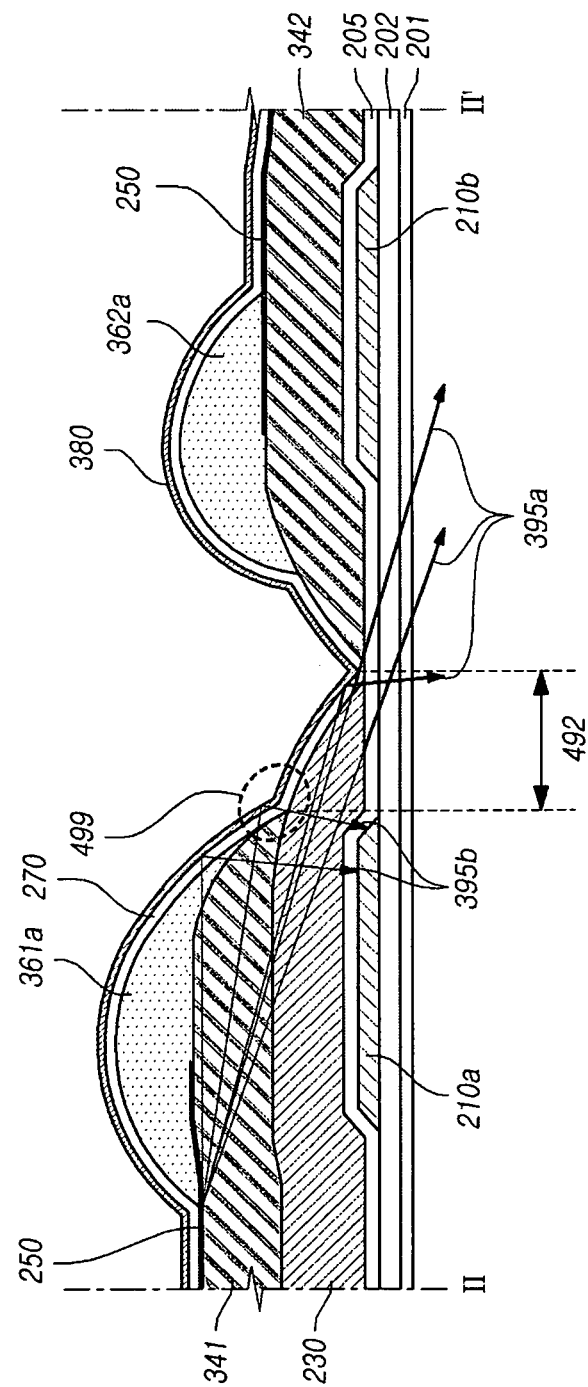
FIG. 4 is a view illustrating a structure of an organic light emitting display device according to another embodiment of the present invention.

FIG. 4 is a view illustrating a structure of an organic light emitting display device according to another embodiment of the present invention. In FIG. 3, the hole is positioned correspondingly to the area 392. In FIG. 4, an overcoat is disconnected at an area 492, so that first and second overcoat elements 341 and 342 are formed in the first and second sub pixels 591 and 592, respectively. Meanwhile, as shown in a reference numeral 499, one end of a bank 361*a* may be interlocked, i.e. coincide, with one end of the overcoat element 341. In order to interlock one end of the overcoat element 341 with the one end of the bank 361*a*, the overcoat element and the bank may be simultaneously etched, so that the overcoat element 341 and the bank 361*a* end at the same position. Since this reduces the number of masks used in an etching process, a process cost can be reduced.

As shown in FIGS. 3 and 4, since the cathode 380 makes contact with the exposed portion of the color filter 230, in this example via the organic light emitting element 270, the light reflected by the cathode 380 is emitted to the outside through the color filter 230.

FIGS. 5 to 8 are plan views of a circuit in which a color filter makes contact with a cathode in a boundary area of a pixel according to an embodiment of the present invention in an eliminated sequence. The configuration of FIGS. 5 to 8 corresponds to the configuration of FIG. 3. Since all embodiments of the present invention may be applied to a structure of various thin film transistors, a technical description concerning this is not described, and formed structures of the color filter, the overcoat element, and the bank in a boundary area of a pixel will be described.

Figure 5:
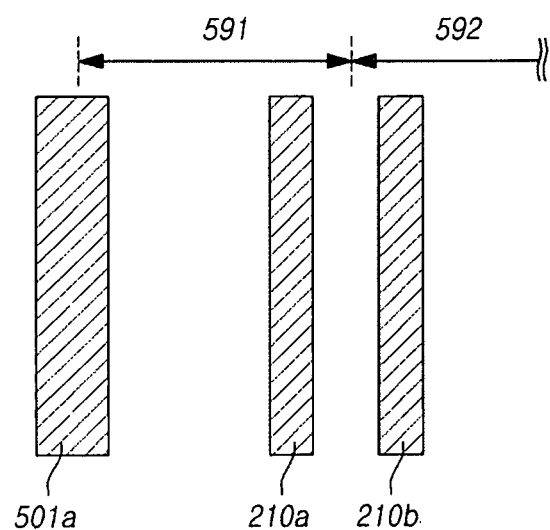
FIGS. 5 to 8 are plan views of a structure in which a color filter makes contact with a cathode in a boundary area of a pixel according to an embodiment of the present invention in an eliminated sequence.

FIG. 5 is a view in which a data line, an EVDD (a high voltage supply line), and a Vref line according to an embodiment are formed. The data lines 210*a* and 210*b* and the EVDD 501*a* may be positioned, and each data line 210*a* and 210*b* may be positioned at the boundary area of the sub pixel areas. The described description has been made based on two sub pixel areas 591 and 592. Meanwhile, in FIG. 5, a reference numeral 501*a* applies the EVDD, according to another embodiment, the reference numeral 501*a* may be a data line, and the present invention is not limited to such a circuit structure or a line structure.

Figure 6:
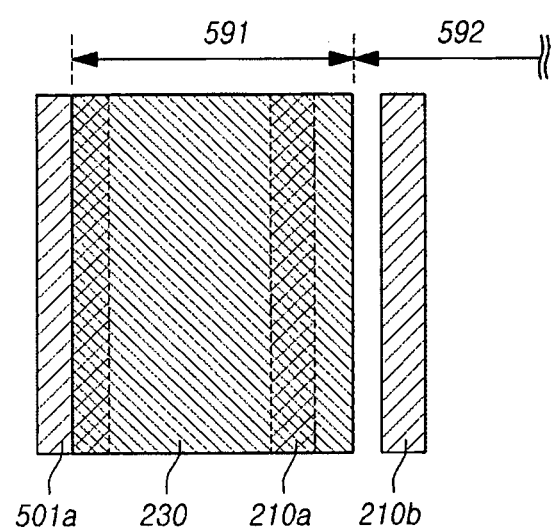

FIG. 6 is a view illustrating a configuration in which a color filter according to an embodiment of the present invention is formed. FIG. 6 illustrates an embodiment in which the color filter 230 is positioned in only a sub pixel area 591. A sub pixel area 592 shows a sub pixel area where the color filter is not positioned as a white pixel. A boundary line of the color filters is positioned in a boundary area of two sub pixel areas 591 and 592. As an embodiment, the boundary line of the color filter 230 may be positioned between the first data line 210*a* and the second data line 210*b*.

Figure 7:
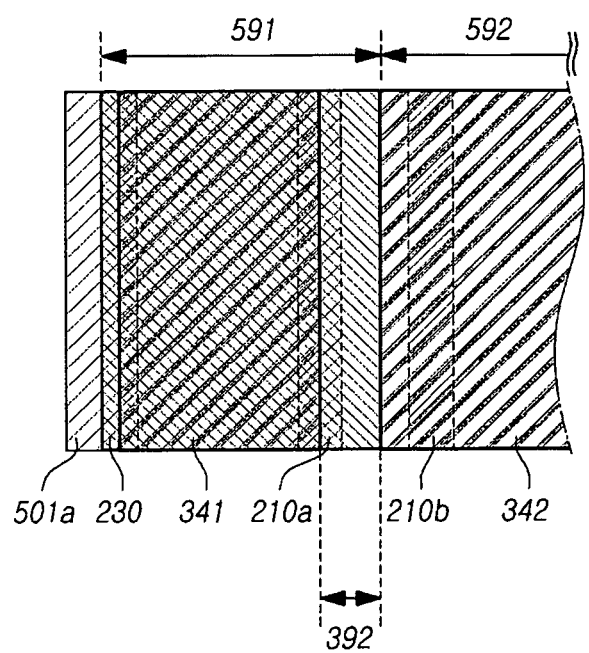
Figure 8:
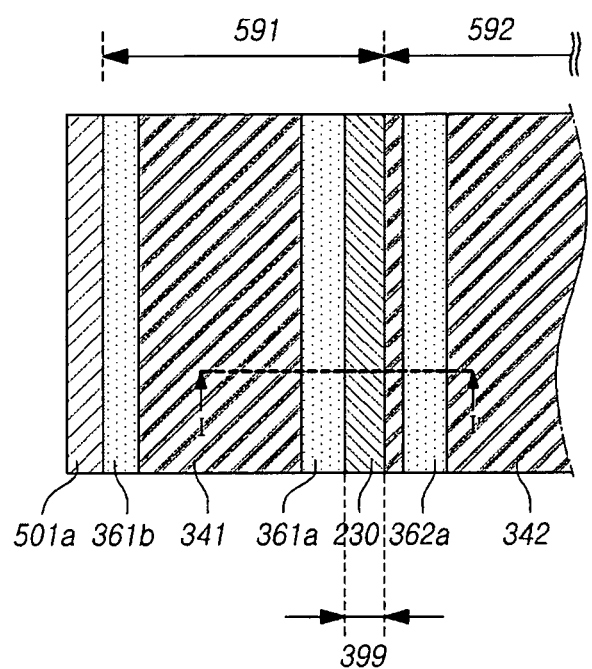

FIG. 7 is a view illustrating a configuration in which an overcoat element according to an embodiment of the present invention is formed. Overcoat elements 341 and 342 may be disconnected in a disconnected area 392 between two adjacent sub pixel areas 591 and 592. Thus, the boundary between the sub pixel areas 591 and 592 may be exposed. The second electrode 280 may make contact with the color filter 230 via the organic light emitting element 270 in the disconnected area 392. In FIG. 7, the boundary between the sub pixel areas 591 and 592 may be exposed by spreading the overcoat material on a whole surface and etching the overcoat material which is positioned between the two sub pixel areas 591 and 592. In this case, the overcoat may be etched using a mask such that the boundary between the sub pixel areas 591 and 592 is exposed. As another embodiment, in the forming of the overcoat element, a spread method using a mask rather than the whole spread is possible. As shown in FIG. 7 and FIG. 8 described later, when the overcoat material is disconnected to expose the boundary of the sub pixel areas 591 and 592, since the cathode makes contact with the color filter in the disconnected area, and the light reflected by the cathode passes through a color filter formed in a corresponding sub pixel area, a color mixing does not occur and thus an accurate color implementation is possible.

Figure 10:
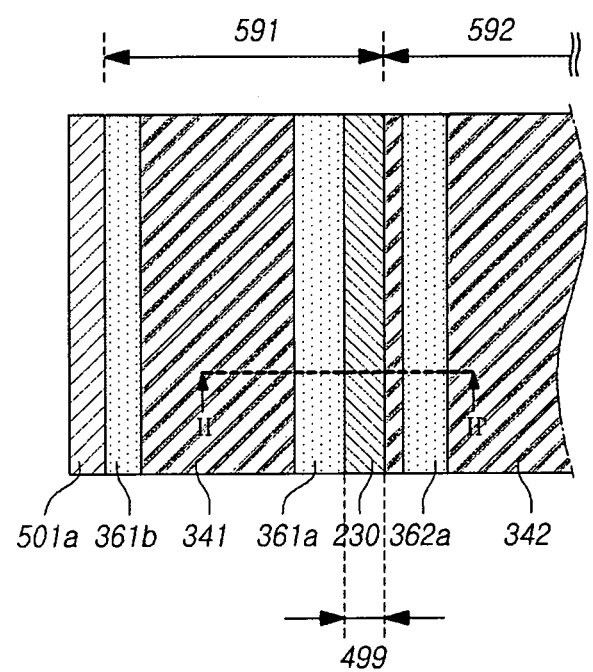

FIG. 8 is a view illustrating a configuration in which a bank according to an embodiment of the present invention is formed. The banks 361*a*, 361*b*, and 362*a* are positioned on the overcoat elements, and are positioned in a boundary area of two sub pixel areas 591 and 592. The bank 361*a* may be formed such that the cathode makes contact with the color filter in the area 399. The cross section taken along line I-I' of FIG. 8 is a configuration described with reference to FIG. 3. The cathode makes contact with the color filter in a disconnected portion where the bank is disconnected. In FIG. 8, a boundary of the sub pixel areas 591 and 592 may be exposed by spreading the bank on a whole surface and etching the bank which positioned between the two sub pixel areas 591 and 592. In this case, the bank may be etched using a mask to expose the boundary of the sub pixel areas. As another embodiment, in the forming of the bank, a spread method using a mask rather than the whole surface spread is possible. As shown in FIG. 8 and FIG. 10 described later, when the bank is disconnected to expose the boundary of the sub pixel areas 591 and 592, since the cathode makes contact with the color filter in the disconnected area, and the light reflected by the cathode passes through a color filter formed in a corresponding sub pixel area, a color mixing does not occur and thus an accurate color implementation is possible. As another embodiment of the present invention, the above-mentioned overcoat element of FIG. 7 and the bank may be simultaneously etched, and in this case, a mask etching in only the boundary area of the pixel areas may be separately used.

Figure 9:
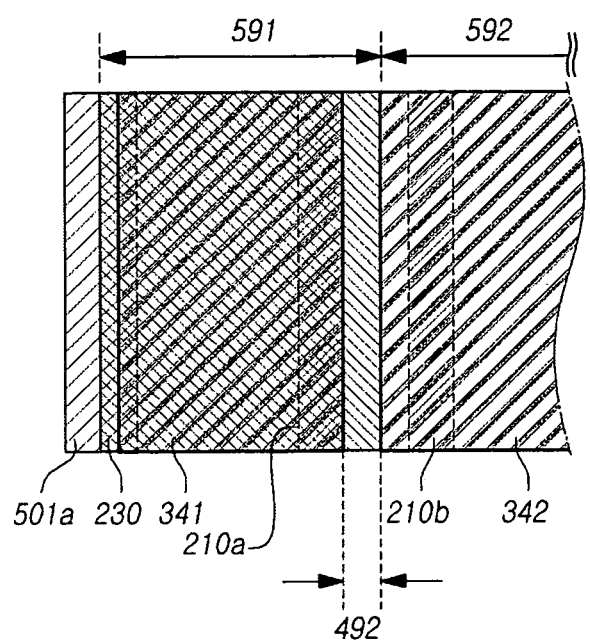
FIGS. 9 and 10 are plan views of a structure in which a color filter makes contact with a cathode in a boundary area of a pixel according to an embodiment of the present invention in an eliminated sequence.

FIGS. 9 and 10 are plan views of a circuit in which a color filter makes contact with a cathode in a boundary area of a pixel according to an embodiment of the present invention in an eliminated sequence. The configuration of FIGS. 9 and 10 corresponds to the configuration of FIG. 4. In FIGS. 3 and 4, the data line 210a and 210b and the color filter 230 are the same. FIG. 9 illustrates a plan configuration in which an overcoat and a bank are formed in a state where elements are eliminated in a sequence of FIG. 5 and FIG. 6.

FIG. 9 is a view illustrating a configuration in which an overcoat element according to an embodiment of the present invention is formed. More specifically, FIG. 9 illustrates a configuration in which overcoat elements 341 and 342 are formed in the configuration of FIG. 4. The overcoat elements 341 and 342 are formed and disconnected in a disconnected area 492 between the two sub pixel areas 591 and 592. Next, in the disconnected area, the cathode and the color filter may be formed such that the cathode makes contact with the color filter. Differently from FIG. 7, where the overcoat element 341 may include a boundary on top of a data line 210a, i.e. the overcoat element 341 may overlap with a part of the data line 201a, the overcoat element 341 in FIG. 9 may completely cover the data line 210a of the sub pixel area.

When the overcoat element is formed in a process of FIG. 13 described later, a result of the etching of the overcoat material using the mask exposing the boundary of the sub pixel areas after spreading the overcoat material on the whole surface of the color filter is a configuration as shown in FIG. 7 or 9. In the same manner, when the bank is formed in the process of FIG. 13, a result of the etching of the bank using the mask exposing the boundary of the sub pixel areas after spreading the bank on the whole surface of the color filter and the overcoat is a configuration as shown in FIG. 8 or 10. A distance between the cathode and the color filter may become narrow by etching the overcoat material and the bank using the mask to expose the boundary of each sub pixel area. Since the cathode covers the color filter only with the organic light emitting element positioned in between and since the color filter has a boundary at the boundary of each sub pixel, the second electrode, e.g. the cathode, may have a substantially vertical portion. Thus, an area where the color filter makes contact with the cathode via the organic light emitting element may be variously increased or decreased according to the thickness of the overcoat element and/or the bank, and the like, so that light reflected by the cathode (second electrode) is transmitted through the color filter. Of course, in order to increase an opening ratio, the area where the color filter makes contact with the cathode may be reduced, and the present invention is not limited to a specific size.

FIG. 10 is a view illustrating a configuration in which one or more banks according to an embodiment of the present invention are formed. The banks 361a, 361b, and 362c are positioned on the overcoat elements 341 and 342, and are positioned in the boundary area of two sub pixel areas 591 and 592. The bank 361a may be formed such that the cathode makes contact with the color filter in the area 499. The cross section taken along line II-II' of FIG. 10 is a configuration described with reference to FIG. 4.

Figure 11:
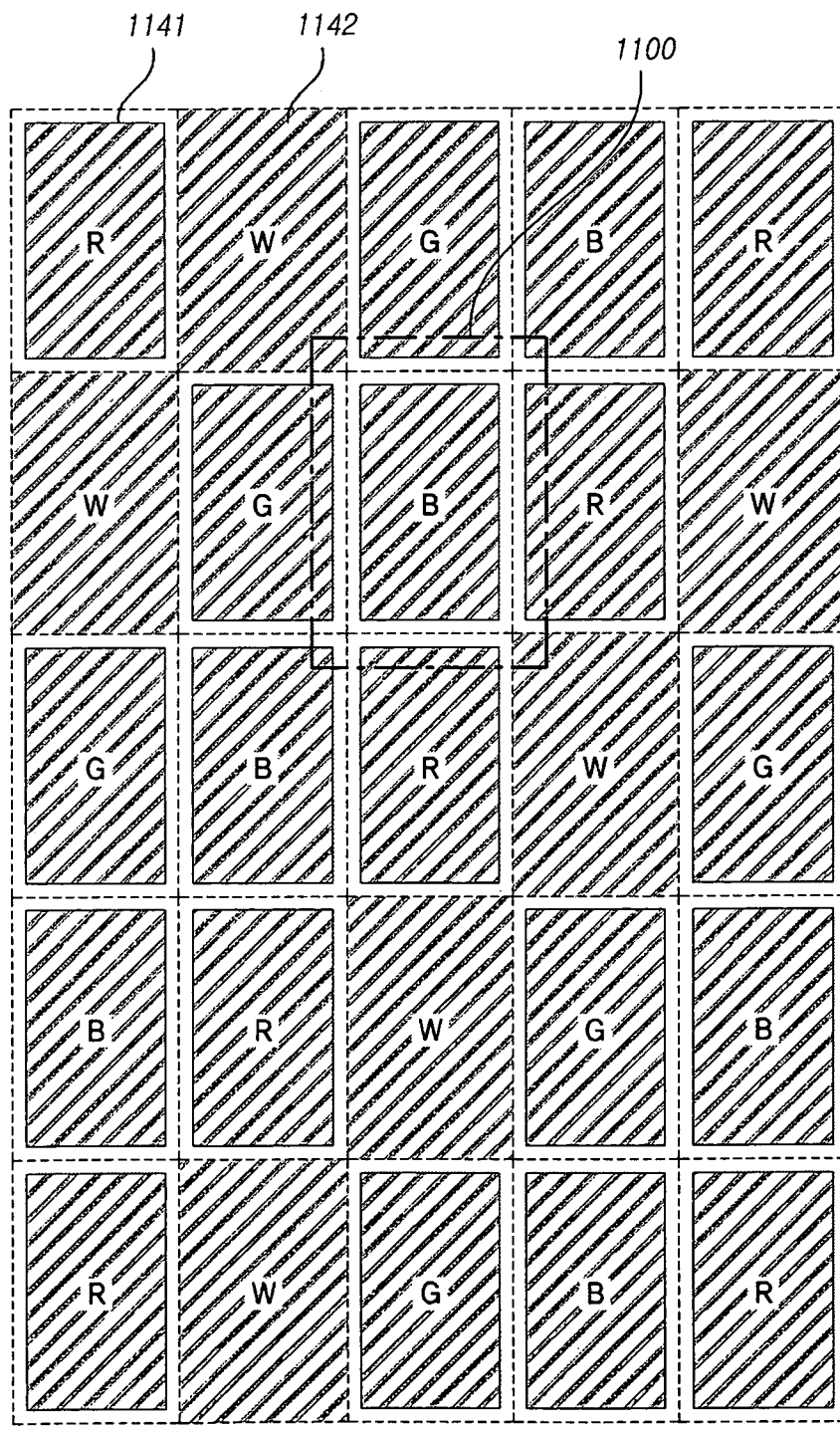
FIGS. 11 and 12 are views illustrating a configuration in which an overcoat element and a bank are formed in a plurality of sub pixel areas according to an embodiment of the present invention.
Figure 12:
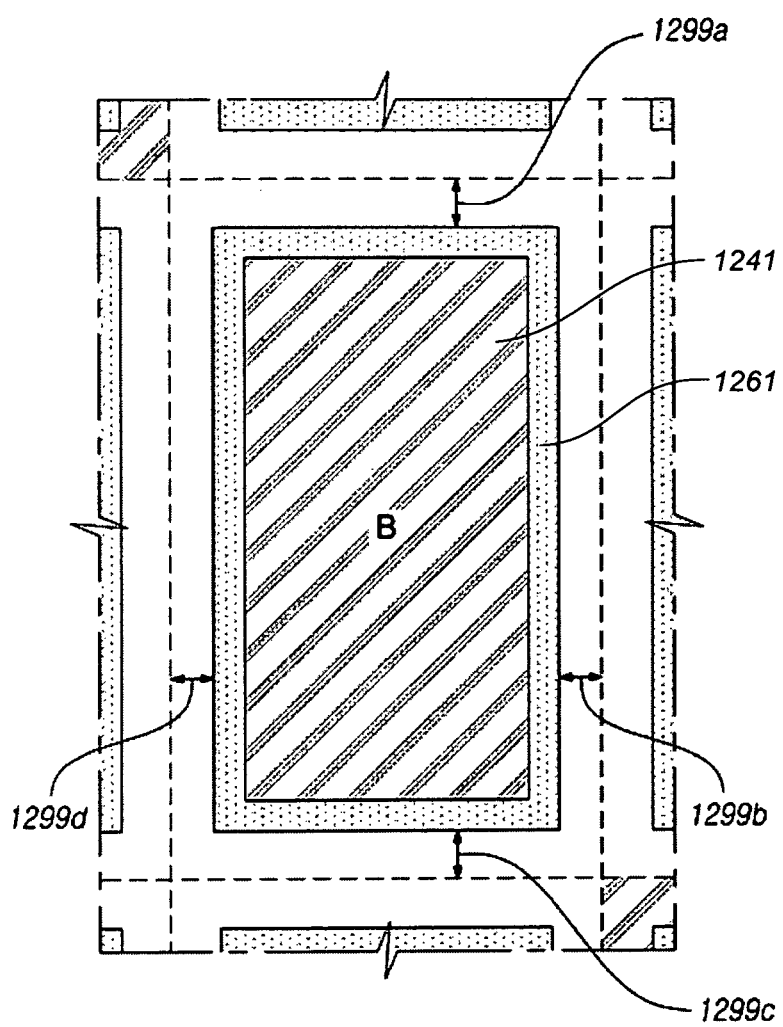

FIGS. 11 and 12 are views illustrating a configuration in which overcoat elements and banks are formed in a plurality of sub pixel areas according to an embodiment of the present invention. In the sub pixel area, a plurality of various color filters may be positioned. A sequence of an arrangement of each color filter may be configured variously according to a display device. As an embodiment, in FIG. 11, a pixel P may include sub pixels RWGB, e.g. arranged in a horizontal direction. In this case, an area of the overcoat element in a sub pixel may be smaller than that of the color filter. That is, the overcoat element exposes an edge of the color filter, and enables the edge of the color filter to make contact with the second electrode. In FIG. 11, 'R' indicates a red sub pixel area, 'W' indicates a white sub pixel area, 'G' indicates a green sub pixel area, and 'B' indicates a blue sub pixel area. A dotted line indicates a boundary line of the color filters. In the white sub pixel area, a color filter may not be formed or a color filter of which a transmittance is high may be formed.

An area of an overcoat element 1141 of a sub pixel area where a color filter is disposed may be smaller than that of the color filter (shown as a dotted line) of the sub pixel area. Thus, the overcoat element 1141 may be disconnected between each sub pixel area. Meanwhile, an area of an overcoat element 1142 of a sub pixel area where no color filter is formed may correspond to the size of the respective sub pixel area. Thus, the overcoat element 1142 of the white sub pixel area W may occupy an area larger than that occupied by the overcoat element 1141 of the sub pixel areas R, G, B where color filters are formed. Of course, when the area of the white sub pixel area is small, the size of the overcoat element 1142 formed in the white sub pixel area may be small. To sum up, when a ratio between the area occupied by the overcoat element 1141 and the corresponding sub pixel area where a color filter is disposed is 'SQ_c' and a ratio between the area occupied by the overcoat 1142 and the corresponding white sub pixel area W where a color filter is not formed is 'SQ_w', 'SQ_c' is smaller than 'SQ_w'. In a sub pixel area where a color filter 230 is formed, the bank 361a may be positioned on the color filter. In this case, the overcoat element 341 may be formed with an area smaller than that of the color filter 230. This provides an effect in which the overcoat element of the sub pixel area where a color filter is not formed, such as the white sub pixel, occupies a larger area. This is applied inversely to the present invention. In order to increase an opening ratio, the white sub pixel area may be configured such that the white sub pixel area is smaller than that of the sub pixel area where the color filter is formed. By these means, an area of an overcoat element in a sub pixel with color filter and in a sub pixel without color filter may be equalized. That is, an opening ratio may be maintained or increased while differentiating the sub pixel areas according to properties of each sub pixel rather than forming the sub pixel areas in the same area.

As described above with reference to FIGS. 3 to 10, the bank 361a may be formed such that a portion or a whole of the bank 361a overlaps the overcoat element 341. The bank 361a may cover a boundary portion between the overcoat element 341 and the color filter 230 (FIG. 3), or the bank 361a and the overcoat element 341 may have a common boundary portion to the color filter 230 (FIG. 4).

FIG. 12 illustrates an enlarged view of a reference numeral 1100, and an area where the bank is formed is described with reference to FIG. 12.

In FIG. 12, an overcoat element 1241 is formed on a blue sub pixel area B. A bank 1261 is formed on the overcoat element 1241 as described with reference to FIG. 3 or FIG. 4. Meanwhile, since the overcoat element 1241 and the bank 1261 are disconnected from, a bank and an overcoat element of an adjacent pixel, reference numerals 1299a, 1299b, 1299c, and 1299d indicate areas where the cathode makes contact with the color filter (via the organic light emitting element). As shown in FIGS. 3 and 4, the light reflected by the cathode is input to the color filter again. Therefore, a color mixing between adjacent pixels is prevented.

As described with reference to FIGS. 11 and 12, in order to prevent the color mixing between adjacent pixels, the second electrode (e.g. cathode) may make contact with the color filter in the boundary of the sub pixel area such that the light reflected by the cathode is reflected to the color filter of the corresponding sub pixel area. Since the cathode positioned in each sub pixel area reflects the light toward the color filter at an area where the cathode makes contact with the color filter, a possibility of a color mixing of different light between adjacent sub pixel areas or a passing of the reflected light through a color filter of an adjacent pixel area is reduced, and thus an unmixed color can be implemented.

In production of a large OLED panel and display device, since the number of exposures for each layer is increased, a luminance/color sensing difference occurs according to each exposure process deviation, and thus a stitch spot defect may occur. An embodiment of the present invention provides a display panel having a vertical structure in which layers such as an overcoat, a bank, and the like, which may be a light path, are removed between a cathode layer and the pigments forming a color filter, and the cathode layer makes contact with the pigment of the color filter as close as possible, and thus light reflected by the cathode passes through the pigment. When an embodiment of the present invention is used, a light leakage except for an emissive pixel is blocked, and thus a color sensing difference and a stitch spot can be improved.

That is, when the present invention is configured, as described with reference to FIGS. 3 and 4, the color sensing difference is improved by providing a boundary area of the color filters, for example, a structure in which the cathode is close to the pigments forming the color filter. Meanwhile, in order to remove the overcoat material between the color filter and the cathode, a hole through which the overcoat material is removed may be formed, and the hole of the overcoat material and the hole of the bank may be simultaneously formed. Generally, as described with reference to FIGS. 8 and 10, the overcoat and/or the bank may be disconnected between the pixels. That is the overcoat and/or the bank may expose a boundary portion between adjacent sub pixels.

Figure 13:
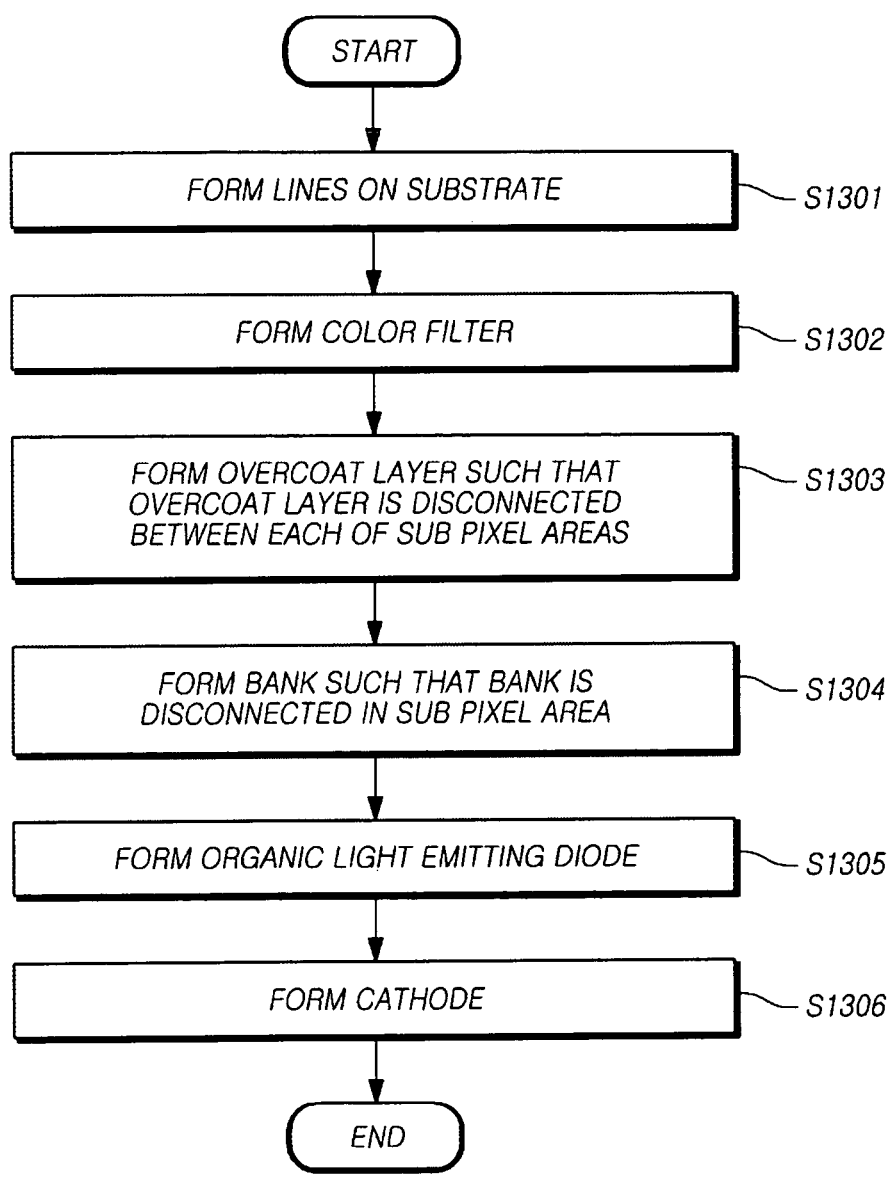
FIG. 13 is a view illustrating a process of forming an overcoat element and a bank on a color filter according to an embodiment of the present invention.

FIG. 13 is a view illustrating a process of forming an overcoat element and a bank on a color filter according to an embodiment of the present invention.

As described with reference to FIGS. 5 to 10, various lines such as a gate line, a data line, a driving voltage power line, and a reference voltage power line are formed on a substrate (S1301). The lines may be formed on the same layer or on different layers in consideration of signals transferred through the lines and a relation between the lines. When the forming of the lines is finished, a color filter 230 is formed (S1302). The color filter may include an emitting area between the lines as shown in FIG. 6. In order to form various color filters, three color filters R, G, and B may be formed using three types of masks.

After forming the color filter 230, an overcoat element 341 is formed. The overcoat may be disconnected between adjacent sub pixel areas (S1303). To this end, as shown in FIG. 11, the overcoat element may be formed in a quadrangle shape. In a boundary portion of the sub pixel area, the overcoat element may not be formed. Thus, in the boundary portion of the sub pixel area, the overcoat element 341 may expose the color filter. Therefore, the overcoat element may be formed such that the overcoat element occupies an area smaller than that of the color filter in the sub pixel area. In order to form the overcoat element which is disconnected in the sub pixel area, an overcoat material may be spread and the overcoat material may be etched in a pixel area. Alternatively, the overcoat material may be formed using one mask such that the overcoat material is disconnected in each pixel area. Any of the methods in which the overcoat material is deposited and etched, and the method in which the overcoat material is deposited in the disconnected form using the mask may be used for implementing the present invention.

In a method of forming the overcoat element, when the overcoat is etched using the mask exposing the boundary of the sub pixel area after spreading the overcoat material on the whole surface of the color filter, as shown in FIG. 4, a boundary of the overcoat may be made to be in contact or to correspond with a boundary of the bank. Alternatively, the overcoat material may be etched such that the boundary of the overcoat element is inside of the boundary of the bank as shown in FIGS. 3 and 11. On the overcoat element 341, a first electrode or pixel electrode 250 may be formed.

Next, one or more banks may be formed. The bank in the various sub pixel areas may be formed such that the bank is disconnected in the pixel area P (S1304). Hence, in the same manner as the overcoat elements, the bank is also disconnected in the pixel area P. In order to form the bank which is disconnected in the pixel area, the bank may be deposited using a mask. Alternatively, after depositing the bank in an area of a whole display panel, the bank may be etched using a mask. In order to etch the bank and the overcoat element in the pixel area, after the bank and the overcoat materials are formed, the bank and the overcoat elements may be simultaneously etched in the pixel area. Thus, as shown in FIGS. 3 and 4, the bank may either be fully disposed on the overcoat element 341, or the bank 361a may be partially disposed on the overcoat element and partially on the color filter 230, thus covering a boundary between the overcoat and the color filter.

After the bank is etched, an organic light emitting element 270 may be formed on the structure including the bank (S1305). Then, an (second) electrode 280, e.g. a cathode, may be formed, e.g. on the organic light emitting element (S1306). When the process of FIG. 13 is used, since the cathode makes contact with the color filter in the sub pixel area with the organic light emitting element being interposed between the cathode and the color filter, the light reflected by the cathode is input to the color filter, and thus a possibility of a color mixing and a stitch spot are removed.

While the technical idea of the present invention has been exemplarily described with reference to the accompanying drawings, it will be understood by a person skilled in the art that the present invention may be varied and modified in various forms without departing from the scope of the present invention. Accordingly, the embodiments disclosed in the present invention are merely to not limit but describe the technical idea of the present invention. Further, the scope of the technical idea of the present invention is not limited by the embodiments. The scope of the present invention shall be construed on the basis of the accompanying claims in such a manner that all of the technical ideas included within the scope equivalent to the claims belong to the present invention.

What is claimed is:

1. An organic light emitting display panel comprising:
   a pixel area that includes at least a first sub pixel area, the first sub pixel area comprising:
      a color filter;
      a first overcoat element on the color filter, wherein a portion of the color filter at an edge portion of the first sub pixel area is not covered by the first overcoat element; and
      an electrode disposed on the pixel area, wherein the electrode is on the portion of the color filter not covered by the first overcoat element,
      wherein a boundary of the first overcoat element is apart from a boundary of the color filter.

2. The display panel of claim 1,
   wherein the electrode is in direct contact with the portion of the color filter not covered by the first overcoat element, or
   wherein the electrode is in direct contact with an organic light emitting element, the organic light emitting element in direct contact with the portion of the color filter not covered by the first overcoat element.

3. The display panel of claim 1, the first sub pixel area further comprising a pixel electrode disposed on the first overcoat element, the pixel electrode connected to a thin film transistor of the display panel.

4. The display panel of claim 1, wherein the first overcoat element has a smaller area than the first sub pixel area and/or than the color filter of the first sub pixel area.

5. The display panel of claim 1, the pixel area further including a second sub pixel area that is adjacent to the first sub pixel area, the second sub pixel area including no color filter.

6. The display panel of claim 5, wherein the first overcoat element of the first sub pixel area has a smaller area than an area of a second overcoat element of the second sub pixel area.

7. The display panel of claim 5, wherein the second sub pixel area is smaller than the first sub pixel area.

8. The display panel of claim 5,
   wherein the first overcoat element of the first sub pixel area and a second overcoat element of the second sub pixel area are disconnected from each other to expose a boundary between the first sub pixel area and the second sub pixel area, and/or
   wherein a gap is between the first overcoat element of the first sub pixel area and the second overcoat element of the second sub pixel area at the boundary between the first sub pixel area and the second sub pixel area.

9. The display panel of claim 1, wherein the electrode is a cathode electrode of the organic light emitting display panel.

10. An organic light emitting display panel comprising:
    a pixel area that includes at least a first sub pixel area, the first sub pixel area comprising:
       a color filter;
       a first overcoat element on the color filter, wherein a portion of the color filter at an edge portion of the first sub pixel area is not covered by the first overcoat element;
       an electrode disposed on the pixel area, wherein the electrode is on the portion of the color filter not covered by the first overcoat element; and
       a bank formed in the edge portion of the first sub pixel area, wherein the portion of the color filter is not covered by the first overcoat element and the bank.

11. The display panel of claim 10,
    wherein at least a portion of the bank is positioned on the first overcoat element,
    wherein a boundary of the bank and a boundary of the first overcoat element coincide, or
    wherein the boundary of the bank is offset from the boundary of the first overcoat element, such that the portion of the bank directly contacts the first overcoat element and another portion of the bank directly contacts the color filter.

12. A method of manufacturing an organic light emitting display panel with a pixel area including at least a first sub pixel area, the method comprising:
    forming a color filter in the first sub pixel area;
    forming a first overcoat element on the color filter in the first sub pixel area, wherein a portion of the color filter at an edge portion of the first sub pixel area is not covered by the first overcoat element;
    forming an electrode on the pixel area, wherein the electrode is on the portion of the color filter not covered by the first overcoat element;
    forming at least a portion of a first bank of the first sub pixel area on an edge portion of the first overcoat element, wherein forming the first bank comprising,
       spreading bank material on a whole surface of the color filter and the first overcoat element, and
       etching the bank material using a mask which exposes the portion of the color filter to form the first bank; and
    forming an organic light emitting element on the first bank and the first overcoat element.

13. The method of claim 12, wherein a boundary of the first bank and a boundary of the first overcoat element coincide, or wherein the boundary of the first bank is offset from the boundary of the first overcoat element, such that the portion of the first bank directly contacts the first overcoat element and another portion of the first bank directly contacts the color filter.

14. The method of claim 12, wherein forming the first overcoat element comprises:
    spreading overcoat material on a whole surface of the color filter; and
    etching the overcoat material using a mask which exposes the portion of the color filter to form the first overcoat element.

15. The method of claim 12, further comprising:
    forming a second overcoat element in a second sub pixel area adjacent to the first sub pixel area, wherein the first overcoat element and the second overcoat element are disconnected from each other to expose a boundary between the first sub pixel area and the second sub pixel area; and forming a second bank on the second overcoat element in the second sub pixel area, wherein the second bank is disconnected from the first bank.

16. The method of claim 15, wherein a boundary of the second overcoat element is positioned in between the first bank of the first sub pixel area and the second bank of the second sub pixel area.

* * * * *